United States Patent
Wang et al.

(10) Patent No.: US 9,000,561 B2
(45) Date of Patent: Apr. 7, 2015

(54) PATTERNED GROUND SHIELD STRUCTURES AND SEMICONDUCTOR DEVICES

(71) Applicant: Semiconductor Manufacturing International (Shanghai) Corporation, Shanghai (CN)

(72) Inventors: Xining Wang, Shanghai (CN); Jenhao Cheng, Shanghai (CN); Ling Liu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/078,946

(22) Filed: Nov. 13, 2013

(65) Prior Publication Data
US 2014/0361401 A1    Dec. 11, 2014

(30) Foreign Application Priority Data
Jun. 5, 2013 (CN) .......................... 2013 1 0224040

(51) Int. Cl.
*H01L 49/02* (2006.01)
*H01L 23/522* (2006.01)

(52) U.S. Cl.
CPC ............ *H01L 28/10* (2013.01); *H01L 23/5227* (2013.01); *H01L 23/5225* (2013.01); *H01L 2924/19042* (2013.01); *H01L 2924/19051* (2013.01); *H01L 2924/19104* (2013.01)

(58) Field of Classification Search
CPC ...... H05K 9/00; H01L 23/58; H01L 23/5225; H01L 2924/35
USPC .......................................................... 257/531
See application file for complete search history.

(56) References Cited

U.S. PATENT DOCUMENTS

| | | | | |
|---|---|---|---|---|
| 8,217,747 | B2* | 7/2012 | Tiemeijer | 336/200 |
| 2004/0222511 | A1* | 11/2004 | Zhang | 257/686 |
| 2008/0150670 | A1* | 6/2008 | Chung et al. | 336/84 C |
| 2010/0164672 | A1* | 7/2010 | Moon | 336/200 |
| 2011/0133875 | A1* | 6/2011 | Chiu et al. | 336/200 |
| 2012/0056297 | A1* | 3/2012 | Akhtar et al. | 257/531 |
| 2013/0249660 | A1* | 9/2013 | Ler et al. | 336/200 |

* cited by examiner

*Primary Examiner* — Yu Chen
*Assistant Examiner* — Nilufa Rahim
(74) *Attorney, Agent, or Firm* — Anova Law Group, PLLC (57) ABSTRACT

A patterned ground shield structure is provided. The patterned ground shield structure includes a substrate having a dielectric layer. The patterned ground shield structure also includes a plurality of conductive rings having a plurality of sub conductive rings in the dielectric layer. Further, the patterned ground shield structure includes an interconnection line connecting with all of the sub conductive rings in the dielectric layer. Further, the patterned ground shield structure also includes a ground ring connecting with the interconnection line.

20 Claims, 6 Drawing Sheets

PATTERNED GROUND SHIELD STRUCTURES AND SEMICONDUCTOR DEVICES

CROSS-REFERENCES TO RELATED APPLICATIONS

This application claims the priority of Chinese patent application No. 201310224040.X, filed on Jun. 5, 2013, the entirety of which is incorporated herein by reference.

FIELD OF THE INVENTION

The present invention generally relates to the field of semiconductor technology and, more particularly, relates to patterned ground shield structures and related semiconductor devices

BACKGROUND

In existing integrated circuits (ICs), such as radio frequency ICs (RFICs), etc., inductors are important electronic devices, and property parameters of the inductors may directly affect the performance of the ICs. A majority of the inductors in the ICs may be planar inductors, such as planar spiral inductors, etc. Comparing with conventional coil inductors, the planar inductors have advantages, such as low cost, easy integration, low noise and low power consumption, etc. More importantly, the planar inductors may be compatible with existing IC processes. One important parameter to evaluate an inductor is the quality factor Q.

The quality factor Q of an inductor may be defined as a ratio between the energy stored in the inductor and the energy lost in every oscillating period. A higher quality factor Q may mean that the inductor has a better performance.

One major aspect affecting the quality factor Q of an inductor is the substrate loss. Techniques have been developed to increase the quality factor by decreasing the substrate loss. One of these methods is to form a patterned ground shield between inductors and the substrate on which the inductors are formed. By forming the patterned ground shield, the majority of electric field lines generated by the inductors may be terminated at the patterned ground shield and unable to enter into the substrate, thus the substrate loss may be reduced.

However, in practical applications, although the patterned ground shield may reduce the substrate loss, the quality factor Q of inductors may also be reduced after forming the above patterned ground shield in semiconductor devices having the inductors. The disclosed methods and structures are directed to solve one or more problems set forth above and other problems.

BRIEF SUMMARY OF THE DISCLOSURE

One aspect of the present disclosure includes a patterned ground shield structure. The patterned ground shield structure includes a substrate having a dielectric layer. The patterned ground shield structure also includes a plurality of conductive rings having a plurality of sub conductive rings in the dielectric layer. Further, the patterned ground shield structure includes an interconnection line connecting with all of the sub conductive rings in the dielectric layer. Further, the patterned ground shield structure also includes a ground ring connecting with interconnection line Another aspect of the present disclosure includes a semiconductor structure. The semiconductor structure includes an inductor device. The semiconductor structure also includes a patterned ground shield structure having a substrate, a dielectric layer on the substrate, a plurality of the conductive rings having a plurality of sub conductive rings in the dielectric layer, an interconnection line connecting with all the sub conductive rings in the dielectric layer, and a ground ring connecting with the interconnection line.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

One reason causing the patterned ground shield unable to increase the quality factor Q factor of an inductor may be a relatively large parasitic effect introduced by the existing patterned ground shield. If the patterned ground shield is formed between the inductor and a substrate, the relatively large parasitic effect may be introduced into a semiconductor device having the inductor by the patterned ground shield when high frequency signals are applied onto the inductor.

The parasitic effect may include parasitic resistances and parasitic capacitances. The parasitic effect of the semiconductor device introduced by the ground shield structure may reduce the quality factor Q of the inductor. The disclosed structures and methods may overcome such problem and other problems by forming a patterned ground shield structure with multiple fingers and multiple levels underneath the inductor.

Figure 1:
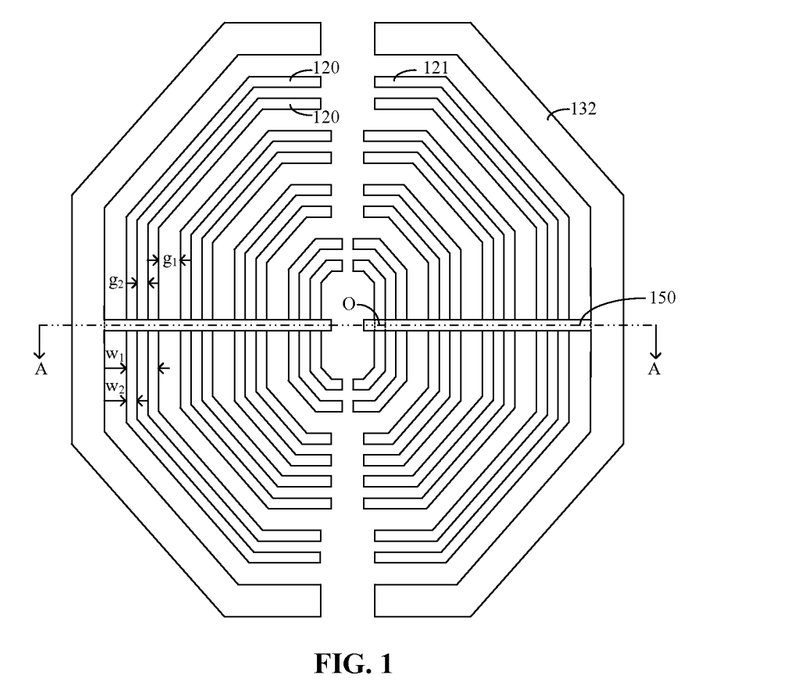
FIG. 1 illustrates a top view of a patterned ground shield structure consistent with the disclosed embodiments.
Figure 2:
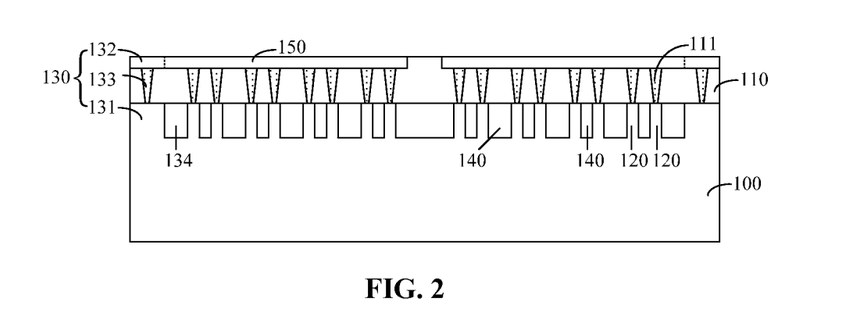
FIG. 2 illustrates a cross-section view of the patterned ground shield structure shown in FIG. 1 along the A-A direction.

FIG. 1 illustrates a top view of a patterned ground shield structure consistent with the disclosed embodiments; and FIG. 2 illustrates a cross-section view of the patterned ground shield structure shown in FIG. 1 along the A-A direction. For illustrative purposes, FIG. 1 does not show a substrate and a dielectric layer underneath the patterned ground shield.

As shown in FIG. 1 and FIG. 2, the patterned ground shield structure may include a substrate 100 and a dielectric layer 110 on the substrate 100.

The substrate 100 may include any appropriate material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, silicon on insulator (SOI), or glass, etc. The substrate 100 may be doped with certain types of ions, such as P-type ions, or N-type ions, etc.

In one embodiment, the substrate 100 is doped with P-type ions. In order to increase the quality factor Q of an inductor formed on the patterned ground shield structure by decreasing the loss of the substrate 100 (substrate loss), a doping concentration of the substrate 100 may be lower than approximately 1E18 atoms/cm$^3$; and a resistivity of the substrate 100 may be in a range of approximately 8 $\Omega \cdot$cm~12 $\Omega \cdot$cm.

The dielectric layer 110 may be made of any appropriate material, such as silicon oxide, silicon nitride, or silicon oxynitride, etc.

Further, the patterned ground shield structure may include a plurality of conductive rings spaced at regular intervals. Among of any two conductive rings, one conductive ring may be surrounded by the other conductive ring. As shown in FIG. 1, a distance between two adjacent conductive rings may be $g_1$.

As shown in FIG. 1 and FIG. 2, each of the conductive rings may include a plurality of sub conductive region rings 120 spaced at regular intervals (may be referred as fingers). Among of any two sub conductive rings 120, one sub conductive ring 120 may be surrounded by the other sub conductive ring 120. A distance between two adjacent sub conductive rings 120 in one conductive ring may be $g_2$. $g_2$ may be smaller than $g_1$, thus all sub conductive rings 120 of the patterned ground shield structure may distribute unevenly.

In one embodiment, a number of the conductive rings may be from 2 to 100; and a number of the sub conductive rings 120 in each of the conductive rings may be from 2 to 10. For illustrative purposes, two sub conductive rings 120 are illustrated in one conductive ring.

In one embodiment, the distance $g_1$ between two adjacent conductive rings may be in range of approximately 2 μm~10 μm. The distance $g_2$ between two adjacent sub conductive rings 120 in one conductive ring may be in range of approximately 0.01 μm~2 μm. In one example, a width of the conductive ring is in a range of approximately 0.4 μm~100 μm, and a width of the sub conductive ring is in a range of approximately 0.04 μm~100 μm. In another example, a width of the conductive ring is in a range of approximately 0.4 μm~100 μm, and a width of the sub conductive ring is in a range of approximately 0.01 μm~2 μm.

The sub conductive rings 120 may be made of any appropriate material, such as Cu, Al, Au, Ti, or poly silicon, etc. All the sub rings 120 may be connected electrically to a ground ring 130.

In a practical fabrication process of the patterned ground shield structure, the patterned ground shield may often be integrated in a same substrate with CMOS transistors, which may cause the process compatibility issues of the patterned ground shield and the CMOS transistors. A process for forming CMOS transistors may often include a process forming active area (AA), a process for forming poly silicon gates, and a process for forming metal interconnections.

For the process forming active area (AA), the process for forming poly silicon gates, and/or the process for forming metal interconnections, in order to obtain a sufficient process window, densities of the active area (AA), the poly silicon gates, and/or the metal interconnections on the substrate may need to match minimum requirements of a manufacturing process. Considering these issues, the active region s (AA), the poly silicon gates, and/or the metal interconnections may be formed on a region of the substrate for forming the patterned ground shield structure; and requirements for the fabrication process of the CMOS transistors may also be matched. Therefore, the process compatibility of the CMOS transistors and the patterned ground shield structure can be possible.

Based on the above analysis, in one embodiment, the sub conductive rings 120 may be first active area (AA) rings. Therefore, as shown in FIG. 2, the patterned ground shield structure may also include a plurality of isolation structures 140 spaced at regular intervals in the substrate 100. Two adjacent first active area (AA) rings may be isolated by the isolation structures 140.

The first active area rings and the CMOS transistors may be formed by a same process step. Further, the isolation structures 140 and isolation structures of the CMOS transistors may also formed by a same process step. In one embodiment, the isolations structures 140 may be shallow trench isolation (STI) structures. Other isolation structures may also be used.

The first active area rings may be doped with a certain type of ions, such as P-type ions, or N-type ions. A resistance of the first active area ring may be lower than a resistance of the substrate 100. In one embodiment, the first active area rings may be heavily doped. A doping concentration of the first active area rings may be greater than approximately 1E18 atoms/cm$^3$. Thus, the resistance of the first active area rings may be reduced; and the substrate loss may be further reduced.

In one embodiment, metal silicides may formed on the first active area rings. The metal silicides may be used to reduce the resistance of the first active area rings; and parasitic resistances of semiconductor devices having inductors introduced by the patterned ground shield structure may be further reduced. Thus, the quality factor Q of the inductors may be increased. The metal silicisides may be formed by a same process step as metal silicides on the active area of the CMOS transistors (semiconductor devices).

In one embodiment, each of the sub conductive rings 120 may be octagonal. Further, as shown in FIG. 1, each of the sub conductive rings 120 may have two openings; and each opening of all the sub conductive rings 120 may be located at a same straight line. Each of the sub conductive rings 120 may be divided into two identical or similar sub conductive ring units 121. When an inductor is formed on the patterned ground shield, the two openings may prevent electric swirls from forming in the sub conductive rings 120, The quality factor Q of the inductor may be further increased.

In certain other embodiments, openings of all sub conductive 120 may be located at different lines, and the electric swirls in the sub conductive rings 120 may also be prevented.

Further, as shown in FIG. 1 and FIG. 2, the patterned ground shield structure may also include an interconnection line 150 in the dielectric layer 110. The interconnection line 150 may connect with the ground ring 130. The interconnection line 150 may also connect with all of the sub conductive ring units 121. Thus, the ground ring 130 may connect with all of the sub conductive rings 120.

The interconnection line 150 and the sub connection rings 120 may be isolated by the dielectric layer 110. As shown in FIG. 2, conductive vias 111 may be formed in the dielectric layer 110 between the interconnection line 150 and the sub conductive rings 120 to achieve an electrical connection between the interconnection line 150 and the sub conductive rings 120. Because each of the sub conductive rings 120 may be divided into two sub conductive ring units 121 by the two openings, it may need to electrically connect the interconnection line 150 with each of the sub conductive ring units 121.

Referring to FIG. 1, all the sub conductive ring units 121 at one side of the opening may electrically connect with one same interconnection line 150. All sub conductive ring units 121 at the other side of the openings may electrically connect with the other same interconnection line 150. Thus, a density of the interconnection lines 150, that is, a number of the interconnection lines in per unit area, may be reduced. When an inductor is formed on the patterned ground shield structure, a relatively large loss caused by a relatively large density of the interconnection lines may be avoided; and the quality factor Q of the inductor may increased.

Further, using a connection position "O" of the sub conductive ring units 121 and the interconnection line 150 as a dividing point, each of the sub conductive ring units 121 may be treated as two parts; and each parts may be equivalent to a resistor. In one embodiment, the connection position "O" the sub conductive ring units 121 and the interconnection line 150 may be at the middle of the sub conductive ring units 121. That is, each of the sub conductive ring units 121 is divided into two equal parts by the connection point "O".

When each of the sub conductive units 121 is divided into two equal parts, the two equal parts may be symmetrical along the interconnection line 150; and equivalent resistances of the two equal parts of the sub connection units 121 may be equal. Further, because the sub connection ring units 121 may electrically connect with the ground ring 130 by the interconnection line 150, paths from the two equal parts of the sub connection ring units 121 to the ground ring 130 may be same; the sub conductive ring units 121 of all the sub connection rings 120 may be symmetrically distributed; and the two parts of each of the conductive ring units 121 may by symmetrical along the interconnection line 150. Therefore, shielding effects of the patterned ground shield may be more uniform.

Further, certain special requirements of some inductors, such as differential inductors, may be matched. For example, when the patterned ground shield structure is formed underneath a differential inductor, the sub conductive ring units 121 of all sub conductive rings 120 may be symmetrically distributed; and the two parts of each of the sub conductive ring units 121 may be symmetrical along the interconnection line 150.

The interconnection line 150 and interconnection lines of COMS transistors may be formed by a same process step. In one embodiment, the interconnection line 150 may be made of Cu, or Al, etc.

In certain other embodiments, each of the sub conductive rings 120 may be rectangular, hexagonal, or circular, etc., uniform shielding effects may also be obtained.

Returning to FIG. 1 and FIG. 2, the ground ring 130 may include a third active area ring 131, a second metal ring 132, and second conductive vias 133. The ground ring 130 may include a third active area ring 131 in the substrate 100. A projection of the ground ring 130 on one surface of the substrate 100 may enclose projections of all the sub conductive rings 120 on the surface of the substrate 100.

The ground ring 130 may also include a second metal ring 132 above the third active ring 131 in the dielectric layer 110. The second metal ring 132 may electrically connect with the interconnection line 150; and the second metal ring 132 and the third active area ring 131 may be isolated by the dielectric layer 110.

Further, the ground ring 130 may include a plurality of second conductive vias 133 in the dielectric layer 110. The second conductive vias 133 may be used to electrically connect the second metal ring 132 with the interconnection line 150. Thus, the ground ring 130 may electrically connect with the interconnection line 150.

Optionally and additionally, a plurality of second isolation structures 134 may be formed in the substrate 100. As shown in FIG. 2, the second isolation structures 134 may be used to isolate the third active area ring 131 from the first active area rings 120.

The third active area ring 131 and the second metal ring 132 may be equivalent to resistors. Because the third active area ring 131 and the second metal ring 132 may both electrically connect with a constant potential, the third active area ring 131 and the second metal ring 132 may be treated as a parallel connection; and an equivalent resistance the ground ring 130 may be reduced. Therefore, a parasitic resistance of the semiconductor devices having an inductor introduced by the patterned ground shield structure may be further reduced, and the quality factor Q of the inductor may be increased.

The third active area ring 131 and active regions of CMOS transistors may be formed by a same process step. The third active area ring 131 may be doped with a certain type of ions, such as P-type ions, or N-type ions. A resistance of the third active area ring 131 may be lower than the resistance of the substrate 100. In one embodiment, the third active area ring 131 may be heavily doped. A doping concentration may be greater than approximately 1E18 atoms/cm$^3$. Thus, the resistance of the third active area ring 131 may be reduced, and the substrate loss may be further reduced.

The second isolation structure 134 and isolation structures of the CMOS transistors may be formed by a same process step. The second isolation structure 134 may be a shallow trench (STI) structure. Other isolation structures may also be used.

The second metal ring 132 and metal interconnection lines of the CMOS transistors may be formed by a same process step. In one embodiment, the second metal ring 132 may be made of Cu, or Al, etc.

As shown in FIG. 1, in one embodiment, the second metal ring 132 and the interconnection line 150 may be on a same plane. The second metal ring 132 and the interconnection 150 may be an integrated structure to have an electrical connection. That is, the second metal ring 132 and the interconnection line 150 may be formed from one material layer with one process step. The dashed lines at the connection region of the second metal ring 132 and the interconnection line 150 may be only for illustrative purposes.

In certain other embodiments, the second metal ring 132 and the interconnection line 150 may be on different planes; and the second metal ring 132 and the interconnection line 150 may be electrically connected by some conductive vias (not shown). The second metal ring 132 and the interconnection line 150 may have overlap regions at connecting positions of the conductive vias.

When using the integrated structure, the second metal ring 132 and the interconnection line 150 may have no overlap region, a density of interconnection lines in the pattern ground shield structure may be reduced. When an inductor is formed on the patterned ground shield structure, a relatively large loss caused by a relatively large density of interconnection lines in the patterned ground shield structure may be prevented, thus the quality factor Q of the inductor may be increased.

The ground ring 130 may also have two openings, similarly; and the ground ring 130 may be divided into two parts by the two openings. When an inductor is formed on the patterned ground shield structure, electric swirls may be prevented from being formed in the ground ring 130. Thus, the quality factor Q of the inductor may be increased.

In one embodiment, the third active region ring 131 and the second metal ring 132 may be octagonal. In certain other embodiments, the third active region ring 131 and the second metal ring 132 may also be triangular, rectangular, or circular, etc.

In certain other embodiments, the third ground ring 130 may only include the third active area ring 131. The third active area ring 131 and the interconnection line 150 may be isolated by the dielectric layer 110. Conductive vias may be formed in the dielectric layer 110, and may be used to electrically connect the first ground ring 130 with the interconnection line 150.

Such patterned ground shield structure may be used underneath an inductor. When a high frequency signal is applied to the inductor, an electric field generated by a high frequency magnetic field may penetrate through the conductive rings of the patterned ground shield structure. An induced voltage and a high frequency current may be generated in the conductive rings; and each of the conductive rings in the patterned ground shield structure may be equivalent to resistors. Because each of the conductive rings may electrically connect with the ground ring 130 having a constant potential, all the conductive rings have a parallel connection. The total resistance of all conductive rings with the parallel connection may be reduced according to the parallel connection principle. Therefore, the parasitic resistance of semiconductor devices having the inductor introduced by the patterned ground shield structure may be reduced; and the quality factor Q of the inductor may be increased.

Further, when divining the conductive rings intro a plurality of sub conductive rings 120, each of the sub conductive rings 120 may be equivalent to resistors. All the sub conductive rings 120 may connect with the ground ring 130 with a parallel connection. By using the parallel connection, the resistance of each sub conductive ring 120 may be reduced, and the total resistance of the patterned ground shield structure may be reduced. The more the number of the sub conductive rings 120 of a conductive ring is, the smaller the resistance of the conductive rings is. Thus, the parasitic resistance of the semiconductor devices having the inductor may be further reduced.

For example, the resistance of a conductive ring may be R before being divided into two sub conductive rings 120. Because the high frequency current may have a skin effect and a proximately effect in a conductor, an effective resistance of the conductor may only be contributed by the surface of the conductor with a depth of a few micrometers. Thus, an effective resistance of the conductive ring may also be contributed by the surface of the conductive ring with a depth of a few micrometers. After each conductive ring is divided into two same sub conductive rings 120, a resistance of each of the sub conductive rings may still be treated as R. Because the two sub conductive ring 120 may have a parallel connection, the resistance of each conductive ring may be 0.5R after the conductive is divided into the two sub conductive rings 120.

Further, the patterned ground shield structure may be used underneath an inductor; each of the sub conductive rings 120 may be equivalent to a resistor; and an electric potential of each sub conductive ring 120 may be different at different positions. For any two sub conductive rings 120 of the patterned ground shield structure, one sub conductive ring 120 may be surrounded by the other sub conductive ring 120. That is, the two sub conductive rings 120 are at relative positions; a coupling capacitor may be formed by the two sub conductive rings 120; and the two sub conductive rings 120 may be the two plates of the coupling capacitor. When the number of the sub conductive rings 120 is greater than three, any sub conductive ring 120 may form two coupling capacitors with two adjacent sub conductive rings 120, except the most outer sub conductive ring 120 and the most inner sub conductive ring 120. Therefore, all the sub conductive rings 120 may form a plurality of coupling capacitors.

Because all the sub conductive rings 120 may connect with the ground ring 130 having a constant potential, all the sub conductive rings 120 may connect together in series. According to the principle of capacitors connecting in series, the total capacitance of all the sub conductive rings 120 connecting in series may be reduced. Therefore, a parasitic capacitance of semiconductor devices having an inductor introduced by the patterned ground shield structure may be reduced; and the quality factor Q of the inductor may be increased.

Figure 3:
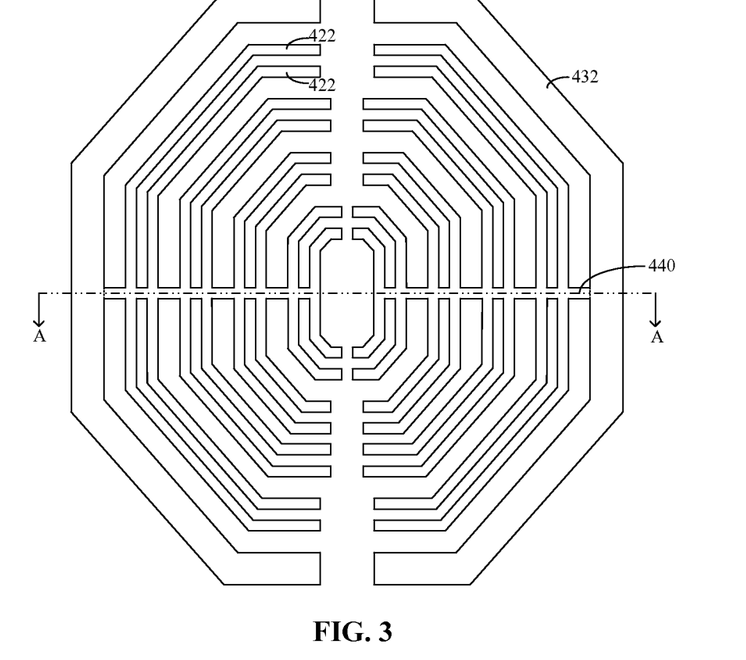
FIG. 3 illustrates a top view of another patterned ground shield structure consistent with the disclosed embodiments.
Figure 4:
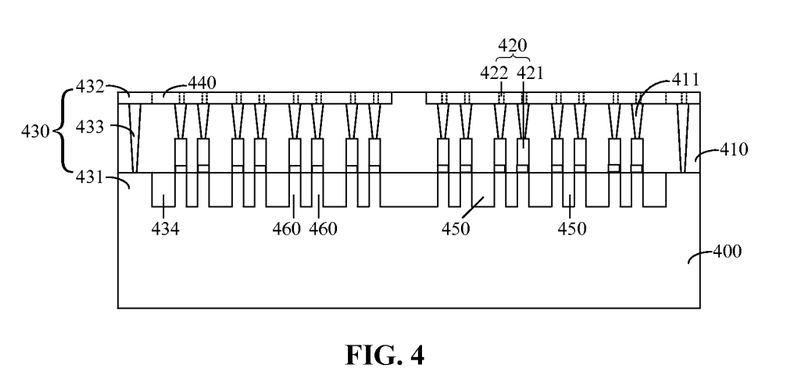
FIG. 4 illustrates a cross-section view of the patterned ground shield structure shown in FIG. 3 along the A-A direction.
Figure 5:
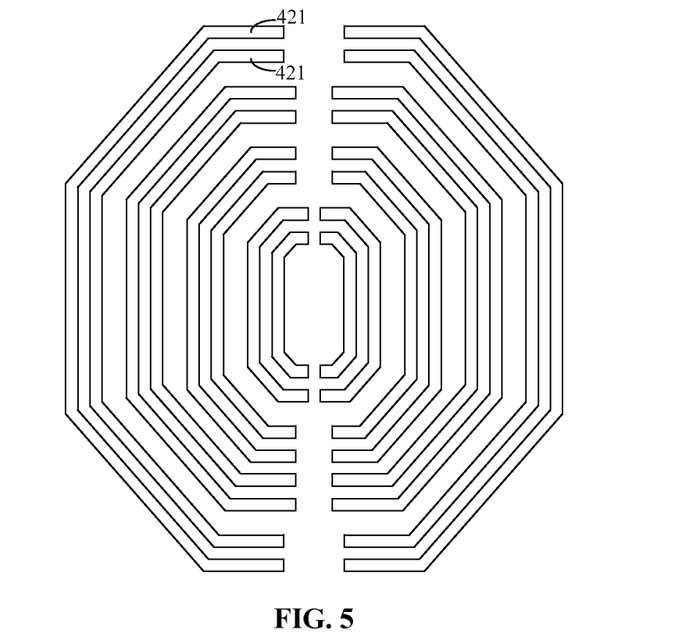
FIG. 5 illustrates a top view of poly silicon rings of the patterned ground shield structure shown in FIG. 3 and FIG. 4.
Figure 6:
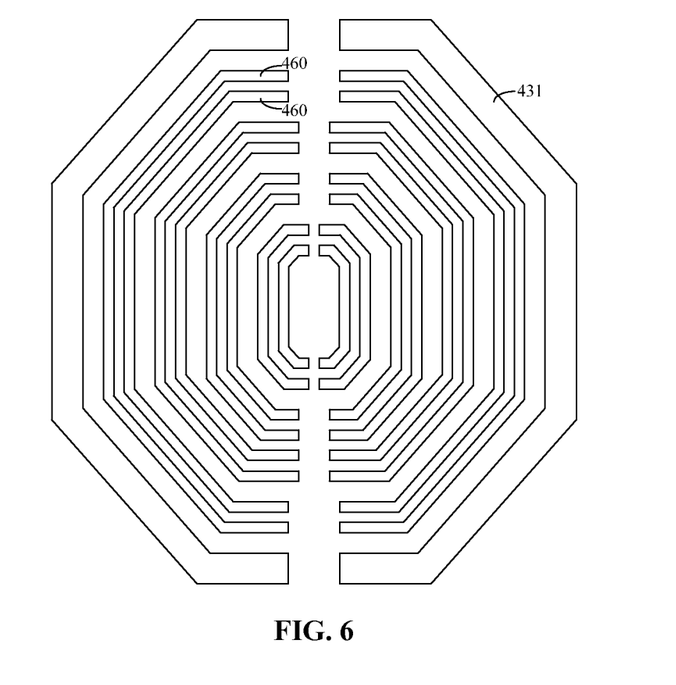
FIG. 6 illustrates a top view second active area rings and a ground ring of the patterned ground shield structure shown in FIG. 3 and FIG. 4.

FIG. 3 illustrates a top view of another patterned ground shield structure consistent with the disclosed embodiments; and FIG. 4 illustrates a cross-section view of the patterned ground shield shown in FIG. 3 along the A-A direction. FIG. 5 illustrates a top view of poly silicon rings of the patterned ground shield shown in FIG. 3 and FIG. 4; and FIG. 6 illustrates a top view a second active area ring and a ground ring of the patterned ground shield shown in FIG. 3 and FIG. 4.

As shown FIG. 3 and FIG. 4, comparing with FIG. 1 and FIG. 2, differences may include that, according to FIGS. 3 and 4, sub conduction rings of the patterned ground shield structure may include poly silicon rings and first metal rings.

As shown in FIG. 3 and FIG. 4, the patterned ground shield structure may include a substrate 400 and a dielectric layer 410 on the substrate 400. Further, the patterned ground shield structure may also include a plurality of second active area rings 460 and a plurality of isolation structures 450. Adjacent second active area rings 460 may be isolated by the isolation structures 450. In certain other embodiments, the second active area rings 460 may be omitted.

Further, the patterned ground shield structure may also include a plurality of sub conductive rings 420 having a plurality of poly silicon rings 421 (e.g., FIG. 5) in the dielectric layer 410 and a plurality of first metal rings 422 and a ground ring 430. The poly silicon rings 421 may be below the first metal rings 422. A projection of the first metal rings 422 on one surface of the substrate 400 and a projection of the poly silicon rings 421 on the surface of the substrate 400 may overlap. The poly silicon rings 421 may electrically connect with the first metal rings 422 by first conductive vias 411. The poly silicon rings 421 and the substrate 400 may be isolated by a dielectric layer.

The projection of the first metal rings 422 on one surface of the substrate 400, the projection of the poly silicon rings 421 on the surface of the substrate 400 and a projection of the second active area rings 460 on the surface of the substrate 400 may overlap. The poly silicon rings 421 and the second active area rings 460 may be isolated by a dielectric layer. Thus, the poly silicon rings 421 may be unable to electrically connect with the ground ring 430.

Among of any two poly silicon rings 421, one poly silicon ring may be surrounded by the other poly silicon ring. Among of any two first metal rings 422, one first metal ring may be surrounded by the other first metal ring.

In one embodiment, a width of any one of the first metal rings 422 may be smaller than a width of any one of the poly silicon rings 421. Thus, a density of metal interconnection lines in the patterned ground shield structure may be reduced. When an inductor is formed on the patterned ground shield structure, a relative large loss caused by a relatively large density of metal interconnection lines in the pattern ground shield structure may be prevented; and the quality factor Q of the inductor may be increased.

The poly silicon rings 421 may be formed with poly silicon gates of CMOS transistors by a same process step. A resistance of the poly silicon rings 421 may be smaller than a resistance of the substrate 400. In one embodiment, the poly silicon rings 421 may be heavily doped. A doping concentration may greater than approximately $1E18$ atoms/cm$^3$. Thus, the resistance of the poly silicon rings 421 may be reduced; and the substrate loss may be further reduced.

The first metal rings 422 may be formed with metal interconnection lines of the CMOS transistors by a same process step. The first metal rings 422 may be made of Cu, or Al, etc.

The second active area rings 460 may be formed with active regions of the CMOS transistors by a same process step. Further, because the projection of the second active area rings 406 on the surface of the substrate 400 and the projection of the ploy silicon rings 421 on the surface of the substrate 400 may overlap, portions of the substrate 400 corresponding to the poly silicon rings 421 may be divided into a plurality of separated parts by the plurality of second active area rings 460. When an inductor is formed on the patterned ground shield structure, electric swirls may be prevented from being formed in the portions of the substrate 400 corresponding to the poly silicon rings 421, thus the quality factor Q of the inductor may be increased.

The dielectric layer between the second active area rings 460 and the poly silicon rings 421 may be formed with gate dielectric layers of the CMOS transistors by a same process step.

Further, as shown in FIG. 3, the patterned ground shield structure may also include an interconnection line 440 in the dielectric layer 410. The interconnection line 440 may electrically connect with the ground ring 430. The interconnection line 440 may also electrically connect with all of the sub conductive rings 420. Thus, all of the sub conductive rings 420 may be electrically connected with the ground ring 430.

In one embodiment, as shown in FIG. 3, the interconnection line 440 and the first metal rings 422 may be on a same plane. Further, the interconnection line 440 and the first metal ring 422 may be an integrated structure. Thus, the interconnection line 440 and the first sub conductive rings 420 may electrically connect.

As shown in FIG. 3, in one embodiment, the ground ring 430 may include a third active area ring 431 in the substrate 400 and a second metal ring 432 above the third active area ring 431. The second metal ring 432 and the interconnection line 440 may electrically connect; and the second metal ring 432 and the interconnection line 440 may be isolated by the dielectric layer 410.

Further, the ground ring 430 may also include a plurality of second conductive vias 433 in the dielectric layer 410. The second conductive vias 433 may be used to electrically connect the second metal ring 432 with the third active area ring 431. Thus, the ground ring 430 may be electrically connected with the interconnection line 440.

As shown in FIG. 3, in one embodiment, the interconnection line 440, the first metal rings 422 and the second metal ring 432 may be on a same plane. The interconnection line 440, the first metal rings 422 and the second metal ring 432 may also be an integrated structure.

Further, as shown in FIG. 4, the patterned shield structure may also include a second isolation structure 434 in the substrate 400. The third active area ring 431 of the ground ring 430 and the second active area rings 460 may be isolated by the second isolation structure 434 (e.g., FIG. 6).

Therefore, the pattered ground shield structure may at least have two levels of conductive rings (fingers), which are the poly silicon rings 421 and the first metal rings 422. A resistance of the metal rings 422 may be greater than a resistance of the poly silicon rings 421, thus the poly silicon rings 422 and the first metal rings 422 may be assumed as gradually increasing conduction lines (fingers) connecting in series. Therefore, a total capacitance may significantly reduced. Further, the multi-finger AA rings (if used), the poly silicon rings 421 and first metal rings 422 may reduce a total resistance at a higher frequency. Therefore, the quality factor of an inductor formed on the patterned ground shield structure may be increased.

Other details may refer to the patterned ground shield structure illustrated in FIG. 1 and FIG. 2. By using the above described patterned ground shield structure, parasitic effects including parasitic resistances and parasitic capacitances of semiconductor devices having an inductor may be reduced, and the quality factor Q of the inductor may be increased.

Figure 7:
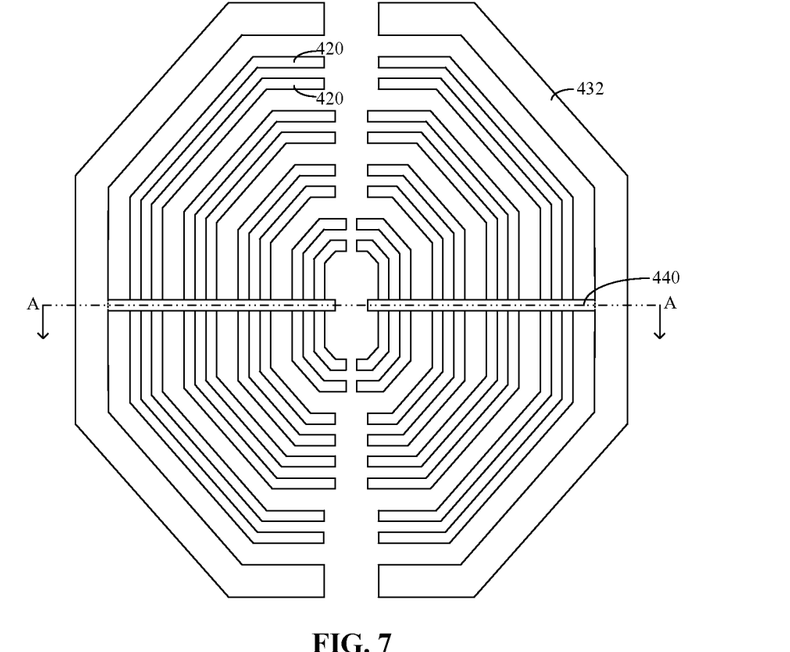
FIG. 7 illustrates a top view of another patterned ground shield structure consistent with the disclosed embodiments.
Figure 8:
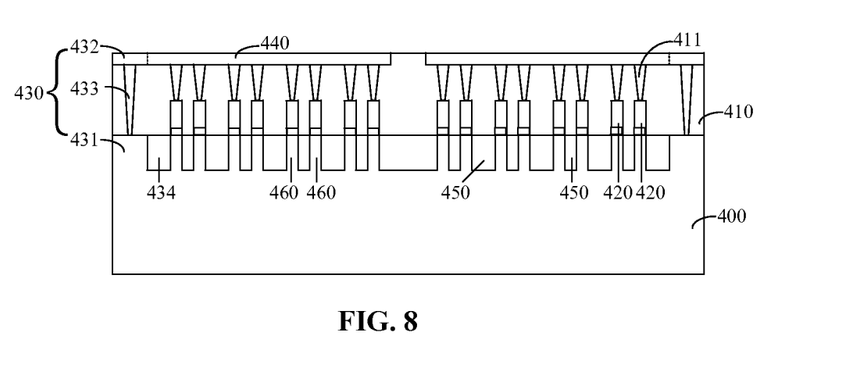
FIG. 8 illustrates a cross-section view of the patterned ground shield structure shown in FIG. 7 along the A-A direction.

FIG. 7 illustrates a top view of another patterned ground shield structure consistent with the disclosed embodiments; and FIG. 8 illustrates a cross-section view of the patterned ground shield shown in FIG. 7 along the A-A direction.

As shown in FIG. 7 and FIG. 8, differences include that the first metal rings in the patterned ground shield structure from the patterned ground shield structure illustrated in FIG. 3 and FIG. 4 may be omitted. Thus, the sub conductive rings 420 of the patterned ground shield structure may only include the poly silicon rings in the dielectric layer 410. First conductive vias 411 may be used to connect the poly silicon rings to the metal interconnection line 440. In certain other embodiments, the second active area rings 460 may also be omitted. Other detailed structures of the patterned ground shield structure may be similar with the patterned ground shield structure shown in FIG. 3 and FIG. 4.

Figure 9:
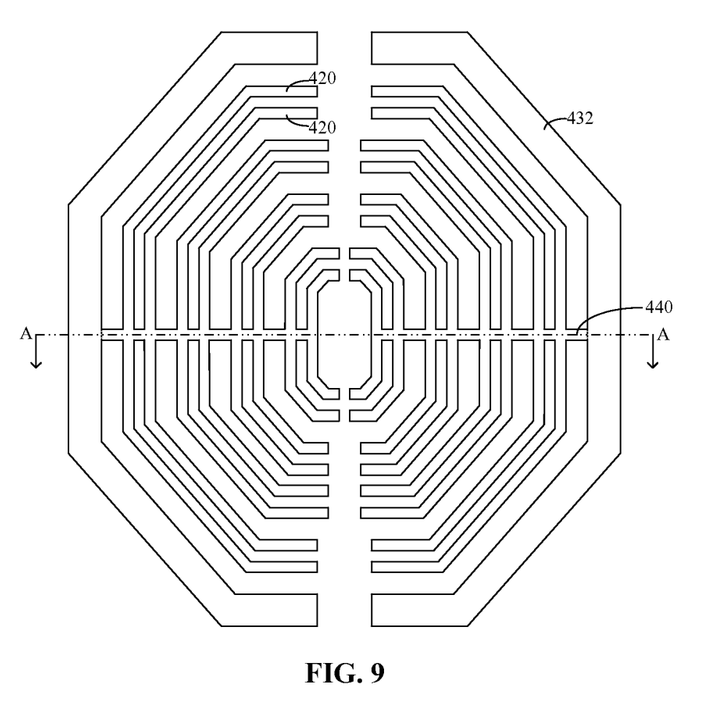
FIG. 9 illustrates a top view of another patterned ground shield structure consistent with the disclosed embodiments.
Figure 10:
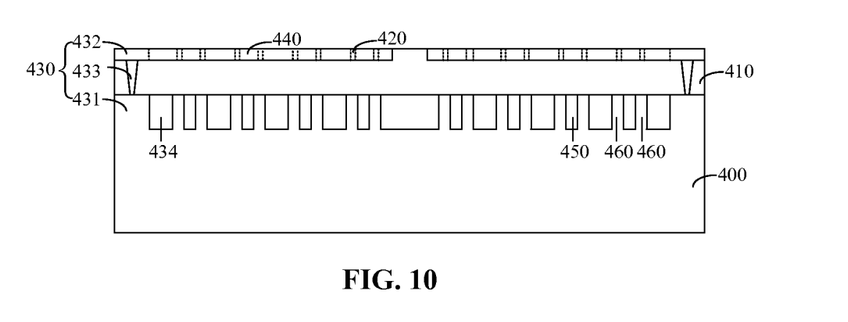
FIG. 10 illustrates a cross-section view of the patterned ground shield shown in FIG. 9 along the A-A direction.

FIG. 9 illustrates a top view of another patterned ground shield structure consistent with the disclosed embodiments; FIG. 10 illustrates a cross-section view of the patterned ground shield shown in FIG. 9 along the A-A direction;

As shown in FIG. 9 and FIG. 10, differences include that the poly silicon rings and first conductive vias of the patterned ground shield structure from the patterned ground shield structure illustrated in FIG. 3 and FIG. 4 may be omitted. Thus, the sub conductive rings 420 of the patterned ground shield structure may only include the first metal rings in the dielectric layer 410. In certain other embodiments, the second active area rings 460 may also be omitted. Other detailed structures of the patterned ground shield structure may be similar with the patterned ground shield structure shown in FIG. 3 and FIG. 4.

Among the above described embodiments, the patterned ground shield shown in FIG. 3 and FIG. 4 may be used under an inductor. When a high frequency signal is applied to the inductor, because the first metal rings 422 and the poly silicon rings 421 may be isolated by the dielectric layer 410, coupling capacitors may be formed. That is, one first metal ring 422 and one corresponding poly silicon ring 421 may be two electrodes of a coupling capacitor. The dielectric layer 410 between the first metal ring 422 and the poly silicon ring 421 may be the dielectric of the coupling capacitor. Similarly, because the poly silicon rings 421 and the second active area rings 460 may also be isolated by the dielectric layer 410, coupling capacitors may also be formed by the poly silicon rings 421 and the second active area rings 460. According to the principle of serial connection of capacitors, a total capacitance of a plurality of coupling capacitors formed by all of the sub conductive rings 420 of the patterned shield ground structure may be decreased. Therefore, parasitic effects of semiconductor devices having the inductor introduced by the patterned ground shield structure may be further reduced, and the quality factor Q of the inductor may be increased.

Thus, a semiconductor device having the pattered ground shield structure may be formed. The semiconductor device may include an inductor device and the patterned ground shield structure under the inductor device. The semiconductor device may also include a dielectric layer between the inductor device and the patterned ground shield structure for isolating the inductor device and the patterned ground shield structure Various types of inductor devices may be used in the semiconductor devices. In one embodiment, the inductor device may an inductor; and the inductor may a planar inductor. The planar inductor may have a plurality of turns. For example, the planar inductor may have two turns. That is, the planar inductor may have a first planar coil and a second planar coil.

Figure 11:
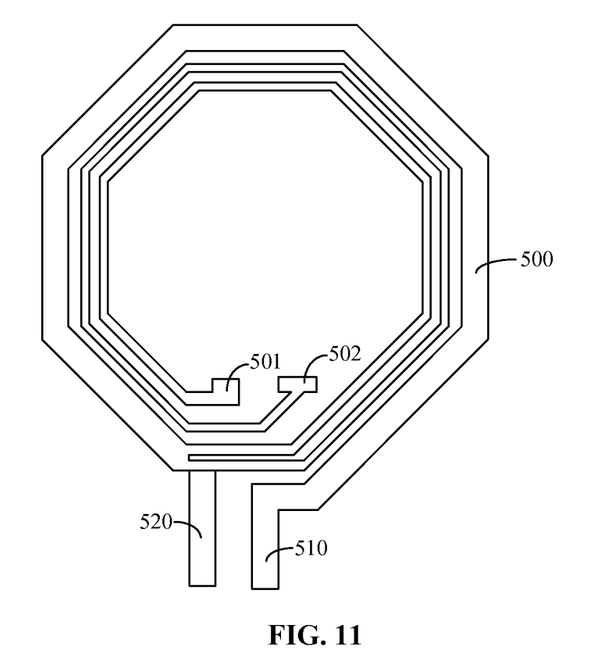
FIG. 11 illustrates a top view of a first planar coil of an inductor consistent with the disclosed embodiments.
Figure 12:
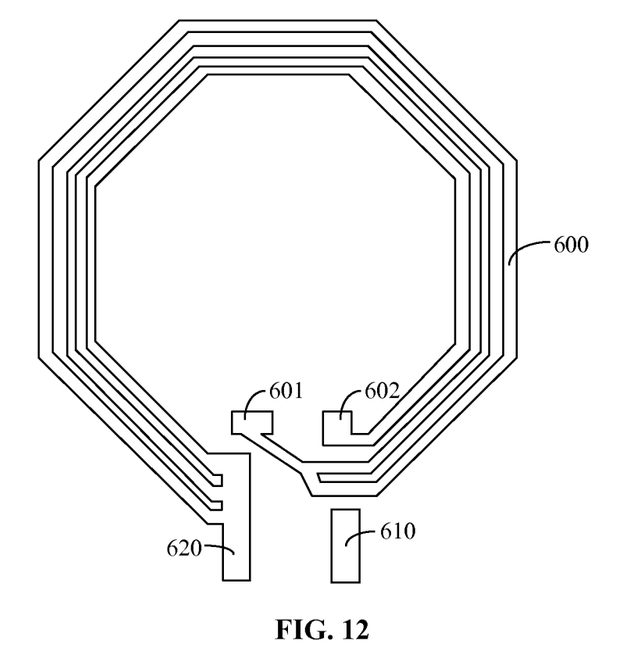
FIG. 12 illustrates a top view of a second planar coil of an inductor consistent with the disclosed embodiments.

FIG. 11 and FIG. 12 illustrate the first planar coil and the second planar coil of the planar inductor used in the semiconductor device, respectively. The first planar coil may be under the second planar coil. The first planar coil and the patterned ground shield structure may be isolated by a dielectric layer. The first planar coil and the second planar coil may also be isolate by a dielectric layer. That is, for the semiconductor devices having inductor devices, the disclosed patterned ground shield structure may be fabricated under the inductor devices to improve the quality factor Q of the inductive device. Although not shown in FIG. 11 and FIG. 12, the patterned ground shield structure may be under either or both the first planar coil and the second planar coil As shown in FIG. 11, the first planar coil may include a first metal ring 500, a first metal contact pad 501, a second metal contact pad 502, a first contact layer 510 and a second contact layer 520, etc. As shown in FIG. 12, the second planar coil may include a second metal ring 600, a first contact pad 601, a second contact pad 602, a first contact layer 610 and a second contact layer 620, etc.

The first contact pad 601 of the second planar coil and the first contact pad 501 of the first planar coil may be electrically connected by a conductive via (not shown) in the dielectric layer (not shown) between the first planar coil and the second planar coil. The second contact pad 602 of the second planar coil and the second contact pad 502 of the first planar coil may be electrically connected by a conductive via (not shown) in the dielectric layer (not shown) between the first planar coil and the second planar coil.

The first contact layer 610 of the second planar coil and the first contact layer 510 of the first planar coil may be electrically connected by a conductive via (not shown) in the dielectric layer (not shown) between the first planer coil and the second planar coil. The second contact layer 620 of the second planar coil and the second contact layer 520 of the first planar coil may be electrically connected by a conductive via (not shown) in the dielectric layer (not shown) between the first planar coil and the second planar coil.

The first planar coil and the second planar coil may be triangular, rectangular, circular, or octagonal, etc. A shape of the first planar coil and the second planar coil may be same as the shape of the conductive rings of the patterned ground shield structure. The shape of the first planar coil and the second planar coil may also be different from the shape of the conductive rings of the patterned ground shield structure.

In one embodiment, a projection of the inductor device on one surface of the substrate may be in a projection of sub conductive rings of the patterned ground shield structure on the surface of the substrate, so that a magnetic field vertical to the substrate generated by the inductor device may be in the sub conductive rings of the patterned ground shield structure.

In certain other embodiments, the inductor device may include any other appropriate device which has a conductive coil; can generate magnetic field; and can induce electric swirls in the substrate, such as transformers, or baluns, etc. When the above described ground shield structures are used under a transformer, or a balun, the quality factor Q of the transformer, or the balun may also be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A patterned ground shield structure, comprising:
   a substrate;
   a dielectric layer on the substrate;
   at least one level of conductive rings, the at least one level includes one or more levels of conductive rings in the dielectric layer, one level of conductive rings in the substrate, or a combination thereof, wherein each level of the at least one level includes:
      a plurality of conductive rings, each conductive ring of the plurality of conductive rings having a plurality of sub conductive rings, wherein:
         one conductive ring of any two conductive rings is surrounded by the other conductive ring of the two conductive rings;
         one sub conductive ring of any two sub conductive rings is surrounded by the other sub conductive ring of the two sub conductive rings; and
         each sub conductive ring of the plurality of sub conductive rings is cut into two sub conductive ring units by two openings;
      a first interconnection line electrically connecting with a first plurality of sub conductive ring units in a level of the at least one level of conductive rings, and a second interconnection line electrically connecting with a second plurality of sub conductive ring units in the level; and
      a ground ring connecting with the first interconnection line and the second interconnection line.

2. The patterned ground shield structure according to claim 1, wherein the sub conductive rings further includes:
   a plurality of first active area rings in the substrate.

3. The patterned ground shield structure according to claim 1, wherein the sub conductive rings further includes:
   a plurality of poly silicon rings isolated from the substrate in the dielectric layer.

4. The patterned ground shield structure according to claim 3, further including:
   a plurality of second active area rings isolated from the poly silicon rings in the substrate.

5. The patterned ground shield structure according to claim 1, wherein the sub conductive rings further includes:
a plurality of first metal rings isolated from the substrate in the dielectric layer.

6. The patterned ground shield structure according to claim 5, further including:
a plurality of second active area rings isolated from the first metal rings in the substrate.

7. The patterned ground shield structure according to claim 1, wherein the at least one level of conductive rings includes:
a plurality of poly silicon rings isolated from the substrate in the dielectric layer; and
a plurality of first metal rings above the poly silicon rings.

8. The patterned ground shield structure according to claim 7, wherein:
in a top view of the patterned ground shield structure, projections of the first metal rings on one surface of the substrate overlap with projections of the poly silicon rings on the surface of the substrate;
the first metal rings and the poly silicon rings are isolated by the dielectric layer; and
the first interconnection line, the second interconnection line, and the first metal rings are connected to the poly silicon rings by conductive vias in the dielectric layer.

9. The patterned ground shield structure according to claim 7, wherein:
a width of the first metal rings is smaller than a width of the poly silicon ring.

10. The patterned ground shield structure according to claim 7, further including a plurality of second active area rings in the substrate and isolated from the poly silicon rings, wherein the ground ring further includes:
a third active area ring isolated from the plurality of second active area rings in the substrate;
a second metal ring in the dielectric layer; and
conductive vias connecting the third active area ring with the second metal ring.

11. The patterned ground shield structure according to claim 10, wherein:
in a top view of the patterned ground shield structure, a projection of the third active area ring on one surface of the substrate encloses a projection of all sub conductive rings on the surface of the substrate.

12. The patterned ground shield structure according to claim 10, wherein:
the plurality of first metal rings, the second metal ring, the first interconnection line, and the second interconnection line are formed from one material layer.

13. The patterned ground shield structure according to claim 1, wherein:
each of the sub conductive rings is rectangular, hexagonal, octagonal, or circular; and
the each sub conductive ring is equally cut into the two sub conductive ring units by the two openings.

14. The patterned ground shield structure according to claim 13, wherein, in a top view of the patterned ground shield structure:
the first interconnection line and the second interconnection line are located on a straight line; and
each sub conductive unit of the two sub conductive units is symmetrical with respect to the straight line.

15. The patterned ground shield structure according to claim 1, wherein:
a number of the conductive rings is in a range of 2~100; and
a number of the sub conductive rings is in a range of 2~10.

16. The patterned ground shield structure according to claim 1, wherein:
a distance between two adjacent conductive rings is in a range of approximately 2 µm~10 µm; and
a distance between two adjacent sub conductive rings in one conductive ring is in a range of approximately 0.01 µm~2 µm.

17. The patterned ground shield structure according to claim 1, wherein:
a width of the conductive ring is in a range of approximately 0.1 µm~100 µm; and
a width of the sub conductive ring is in a range of approximately 0.04 µm~100 µm.

18. The patterned ground shield structure according to claim 1, wherein, in a top view of the patterned ground shield structure, all openings of the plurality of sub conductive rings of the each level are located at a same straight line.

19. A semiconductor device, comprising:
an inductor device; and
a patterned ground shield structure under the inductor device,
wherein:
the patterned ground shield structure includes:
a substrate;
a dielectric layer on the substrate;
at least one level of conductive rings, the at least one level includes one or more levels of conductive rings in the dielectric layer, one level of conductive rings in the substrate, or a combination thereof, wherein each level of the at least one level includes:
a plurality of conductive rings, each conductive ring of the plurality of conductive rings having a plurality of sub conductive rings, wherein:
one conductive ring of any two conductive rings is surrounded by the other conductive ring of the two conductive rings;
one sub conductive ring of any two sub conductive rings is surrounded by the other sub conductive ring of the two sub conductive rings; and
each sub conductive ring of the plurality of sub conductive rings is cut into two sub conductive ring units by two openings;
a first interconnection line electrically connecting with a first plurality of sub conductive ring units in a level of the at least one level of conductive rings, and a second interconnection line electrically connecting with a second plurality of sub conductive ring units in the level; and
a ground ring connecting with the first interconnection line and the second interconnection line.

20. The semiconductor device according to claim 19, wherein:
in a top view of the patterned ground shield structure, projections of the inductor device on a surface of the substrate are in projections of the sub conductive rings on the substrate.

* * * * *